United States Patent
Köhle et al.

(10) Patent No.: US 7,393,614 B2
(45) Date of Patent: *Jul. 1, 2008

(54) SET OF MASKS INCLUDING A FIRST MASK AND A SECOND TRIMMING MASK WITH A SEMITRANSPARENT REGION HAVING A TRANSPARENCY BETWEEN 20% AND 80% TO CONTROL DIFFRACTION EFFECTS AND OBTAIN MAXIMUM DEPTH OF FOCUS FOR THE PROJECTION OF STRUCTURE PATTERNS ONTO A SEMICONDUCTOR WAFER

(75) Inventors: Roderick Köhle, Ottobrunn (DE); Rainer Pforr, Weixdorf (DE); Jörg Thiele, München (DE); Wolfgang Dettmann, München (DE); Markus Hofsäss, München (DE); Mario Hennig, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 372 days.

This patent is subject to a terminal disclaimer.

(21) Appl. No.: 10/792,693

(22) Filed: Mar. 5, 2004

(65) Prior Publication Data
US 2004/0197677 A1    Oct. 7, 2004

(30) Foreign Application Priority Data
Mar. 7, 2003    (DE)    ................... 103 10 136

(51) Int. Cl.
*G03F 1/00* (2006.01)
*G03F 1/14* (2006.01)
(52) U.S. Cl. .......................................... 430/5
(58) Field of Classification Search ...................... 430/5
See application file for complete search history.

(56) References Cited

U.S. PATENT DOCUMENTS

| 5,786,113 | A | 7/1998 | Hashimoto et al. |
| 5,858,625 | A | 1/1999 | Nakao |
| 6,226,074 | B1 * | 5/2001 | Fujisawa et al. ............... 430/5 |
| 6,251,544 | B1 * | 6/2001 | Inoue et al. ..................... 430/5 |
| 6,558,853 | B1 * | 5/2003 | Kawamura ..................... 430/5 |
| 6,680,151 | B2 | 1/2004 | Heissmeier et al. |
| 6,807,662 | B2 * | 10/2004 | Toublan et al. ................. 430/5 |
| 2002/0045136 | A1 * | 4/2002 | Fritze et al. .................... 430/5 |
| 2003/0008219 | A1 | 1/2003 | Kaneko et al. |
| 2003/0027366 | A1 * | 2/2003 | Dulman et al. ................ 438/16 |
| 2004/0053141 | A1 * | 3/2004 | Pierrat ........................... 430/5 |
| 2004/0202943 | A1 * | 10/2004 | Dettmann et al. ............. 430/5 |

FOREIGN PATENT DOCUMENTS

DE    100 06 952 C2    5/2002

* cited by examiner

*Primary Examiner*—Mark F. Huff
*Assistant Examiner*—John Ruggles
(74) *Attorney, Agent, or Firm*—Edell, Shapiro & Finnan, LLC

(57) ABSTRACT

A set of at least two masks for the projection of structure patterns coordinated with one another by a projection system into the same photosensitive layer of a semiconductor wafer, in which the set of at least two masks includes a primary mask having an opaque structure element, which is formed at a first position on the first mask. A second mask of the set, for example a trimming mask, which is assigned to the first mask, can have a semitransparent region assigned to the structure element of the first mask. The semitransparent region can be formed at the same position on the second mask as the opaque structure element on the first mask. With the aid of the suitable choice of the transparency of the semitransparent region, it is possible to enable an undesirable resist region to be trimmed away for enlargement of a process window during exposure of the photosensitive layer on the semiconductor wafer.

9 Claims, 5 Drawing Sheets

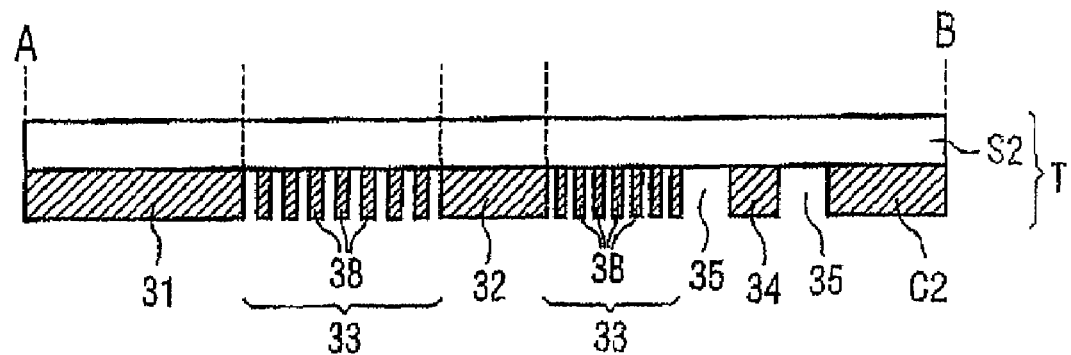
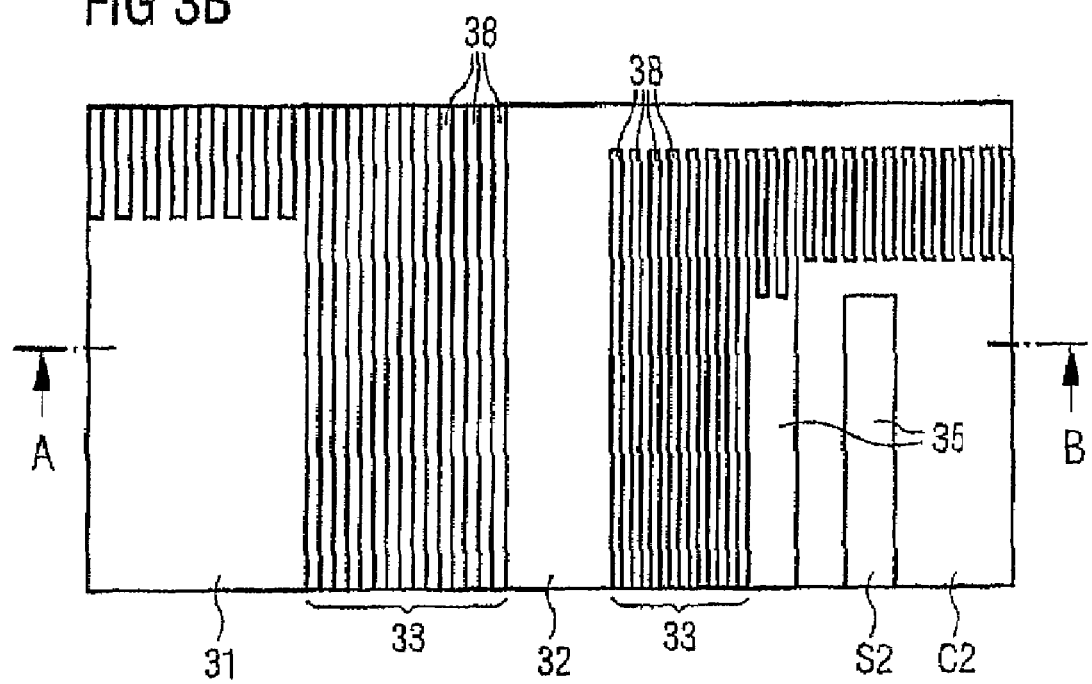

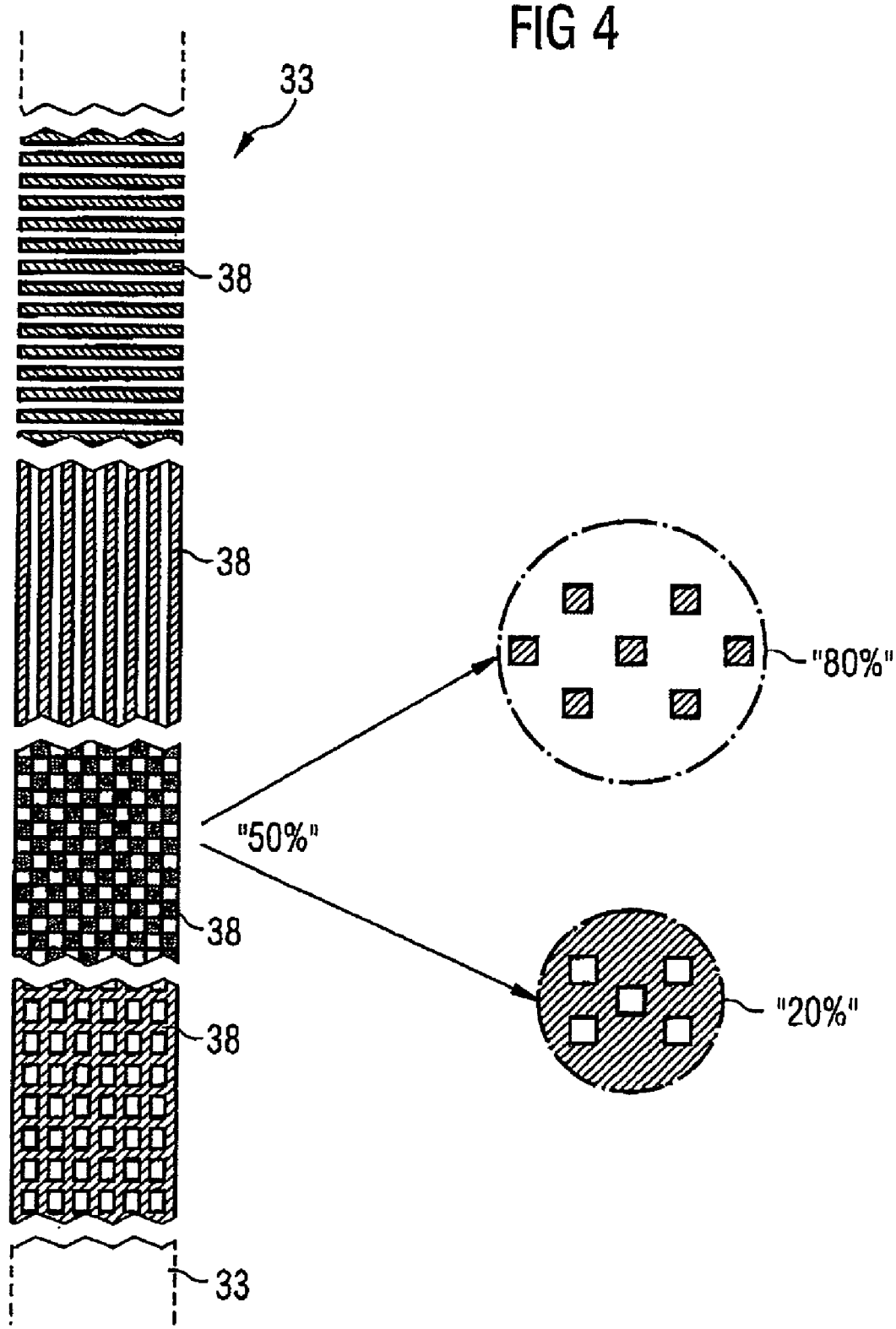

FIG 6A
PRIOR ART
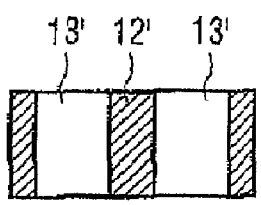
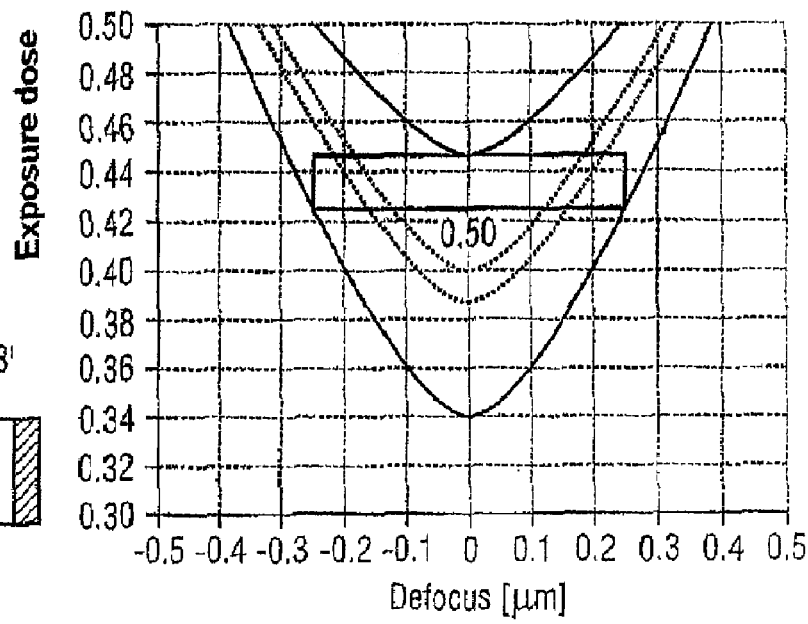
FIG 6B
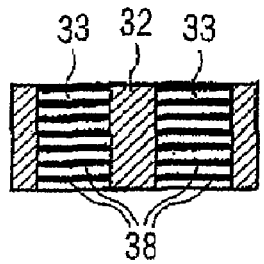
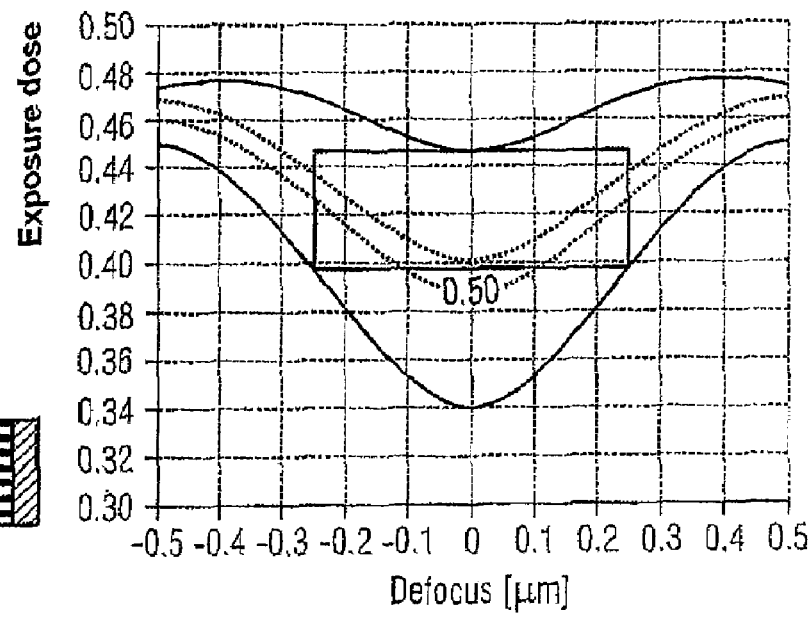

SET OF MASKS INCLUDING A FIRST MASK AND A SECOND TRIMMING MASK WITH A SEMITRANSPARENT REGION HAVING A TRANSPARENCY BETWEEN 20% AND 80% TO CONTROL DIFFRACTION EFFECTS AND OBTAIN MAXIMUM DEPTH OF FOCUS FOR THE PROJECTION OF STRUCTURE PATTERNS ONTO A SEMICONDUCTOR WAFER

CROSS REFERENCE TO RELATED APPLICATIONS

This application claims priority under 35 USC §119 to German Application No. 10310136.5, filed on Mar. 7, 2003, and titled "Set of Masks for the Projection of Structure Patterns, in Each Case Arranged on the Masks of the Set and Coordinated with One Another, Onto a Semiconductor Wafer," the entire contents of which are hereby incorporated by reference.

FIELD OF THE INVENTION

The invention relates to a set of masks for the projection of structure patterns into the same photosensitive layer on a semiconductor wafer in a projection system and more particularly, to a trimming or correction mask for lithography and a method for the production thereof.

BACKGROUND

In the field of semiconductor technology, integrated circuits are usually produced by projection of structure patterns, formed on masks, onto a semiconductor wafer coated in each case repeatedly with a photosensitive resist and a subsequent transferring of the structure pattern into layers respectively arranged underneath the resist. In order to further advance the miniaturization of structure sizes within the structure patterns in semiconductor technology, resolution enhancement techniques (RET) are increasingly being resorted to for the projection. These involve, in addition to illumination methods such as off-axis illumination or structure-specific methods such as optical proximity correction (OPC), primarily innovative mask techniques such as phase masks, for example.

The best resolution results that can be achieved on a semiconductor wafer by an exposure device in a projection are obtained by the type of alternating or chromeless phase mask. Alternating phase masks are particularly suitable for the projection of a dense line-gap pattern formed on such a mask type and having a width ratio of lines to gaps of about 1:1.

However, phase conflicts may occur in the case of the aforementioned types of phase masks. In the case of an exposure, the phase conflicts lead to undesirable, unexposed resist regions in a photosensitive layer arranged on the semiconductor wafer. With the aid of a second or trimming exposure by a further mask, the structure pattern of which is coordinated with that of the first mask, the regions in the photosensitive layer may subsequently be exposed and removed in a downstream development process.

Such a trimming mask is used to eliminate, e.g., the undesirable resist structures produced by phase conflicts by the application of gaplike structures on the trimming mask at precisely those positions which correspond to the positions of the undesirable resist structures on the wafer so that these are first exposed during the projection of the trimming mask. The trimming mask thus brings about the exposure of the same photosensitive layer which has also already been exposed by the aforementioned first mask, for example, an alternating or chromeless phase mask, without the layer having been removed in the meantime.

In this case, it should be noted that the present discussion is based on the use of a positive resist for the photosensitive layer.

Trimming masks are typically embodied as a chrome mask, due to the absence of the stringent requirements made of a structure width to be achieved on the wafer as in the case, for instance, with phase masks. They can be produced cost-effectively and can also be used to produce larger, lithographically less demanding structure elements of a structure pattern to be imaged jointly by both masks, i.e., a lithographic plane, on the wafer.

Since the gaps introduced into the trimming mask, during the projection, are generally to be positioned directly above or at least in the immediate vicinity above the resist structure to be produced on the wafer, an additionally incident radiation is produced by light diffraction at the gap on the trimming mask in an area proximate to the structure element to be transferred on the wafer, which radiation results in an alteration usually a reduction of the intensity gradient at the edge of the structure to be transferred. This gives rise to the disadvantage of a decrease in the size of the lithographic process window for the projection. A lithographic process window is described, for example, by the set of all the pairs of values of exposure parameters such as radiation dose and focus which are used to achieve an imaging of a structure element within a prescribed structure width tolerance on the wafer.

In the case of special arrangements of the structure elements, having, for instance, line widths, mutual distances orientations, etc., this extends even to a situation in which whole parts of structure patterns cannot be imaged sufficiently well. This brings about the exclusion of such arrangements in the design, which, however, leads to considerable limitations even in the creation of the design. This often also results in an enlargement of the circuit area and thus higher fabrication costs on account of the smaller number of product chips on the wafer.

SUMMARY

Improving the quality of the imaging of structure patterns onto semiconductor wafers during projection by trimming mask exposure is desirable. Reducing the costs during component production, increasing the product yield, reducing the fluctuations in the widths of structures formed on a semiconductor wafer, and improving the lithographic process window for a given exposure device are also desirable.

A set of masks for the projection of structure patterns, in each case arranged on the masks of the set and coordinated with one another, into the same photosensitive layer on a semiconductor wafer in a projection system, can include a first mask having at least one essentially opaque structure element and at least one second mask assigned to the first mask. The structure element can be arranged at a first position on the first mask so that, by projection of its image onto the semiconductor wafer, a still unexposed resist region is formed in the photosensitive layer. The second mask can have at least one semitransparent region, which is arranged at a second position on the second mask. The second position can correspond to the first position on the first mask such that by projection of its image on the semiconductor wafer, at least part of the resist region is exposed in the photosensitive layer.

Masks with structure patterns coordinated with one another for projection into the same photosensitive layer on a wafer are, in particular, primary masks and secondary or trimming masks assigned thereto for carrying out a correction exposure on the wafer after a first exposure.

The transmission of the bright gaplike or contact-window-like openings on the trimming mask which are used for trimming undesirable, still unexposed resists structures can be reduced by features of the set of masks because a semitransparent region, instead of a conventional fully transparent region, is arranged on the trimming mask. Incipient exposure of adjacent "active" structure elements (i.e., unexposed resist structures, the existence of which is desired after the trimming exposure as well can be reduced.

By correctly defining the transparency with which the semitransparent regions are formed, it is possible to control the otherwise disadvantageous diffraction effects at the trimming mask gaps to obtain, for example, a maximum of depth of focus, i.e., a focus interval which is permissible for an exposure while complying with a prescribed structure width (CD) tolerance. At the same time, those structures on the trimming mask, which are intended for transferring "active" structures for the circuit function, can retain their full transmission.

With regard to the reduction of the transmission of the semitransparent regions on the second mask, i.e., the trimming mask, the following configurations can be provided according to the invention:

1.) The second mask can include at least one substrate, e.g., a glass carrier, a semitransparent layer applied thereon, and also an opaque layer, e.g., made of chrome, bearing on the latter. The semitransparent layer may be represented, for example, by a layer comprising molybdenum silicide. This layer has a comparatively homogeneous transparency across the glass carrier with values of, for example, between 20 and 80 percent.

The phase deviation accompanying this additionally arranged layer can be, for example, approximately 360° or an integer multiple of this value. Phase effects due to non-integer multiples are not precluded by the invention, however. In particular, a trimming mask formed as a half tone phase mask can also produce resist structures essential for the later circuit function in the photosensitive layer.

The patterning of a mask substrate for the production of the trimming mask according to the invention can be effected as in conventional methods such that the relevant structure pattern coordinated with the first or primary mask for the trimming mask can first be formed in a lithographic process using a mask writer and can then be transferred into the chrome layer in an etching process. In a further structure-selective process, the semitransparent absorber can then be removed, in a second comparable process, below those openings in the chromium layer, which are intended to have 100% transparency on the finished mask. Consequently, after this step, there can be situated on the mask, regions or structure elements, which have a transparency of 100% and are provided for transferring active structures, and those which are semitransparent and are used for trimming, i.e., exposing away, disturbing resist structures.

2.) In another embodiment of this invention, it is provided that some structure elements intended for trimming on the same trimming mask as under item 1.) can also be fully transparent. This is because in the case of special structure arrangements or groupings, the incipient exposure of adjacent "active" structure elements in the resist can lead to an improvement in the depth of focus of the imaging. This is the case whenever the resist structure produced by only a single exposure with the primary mask, i.e., the first or alternating or chromeless phase mask, has a curve shape with a greatly concave profile. The curve arising when the structure width can be plotted against the focus setting which is currently chosen and is varied for testing. Such a curve is also called a Bossung curve. The deviation of a value for the focus setting from a focus setting which yields an optimum imaging is also called defocus.

For this purpose, these special structure elements can be equally uncovered in the second lithographic projection step described under 1.) and the semitransparent layer can be removed below the resulting openings by etching. Consequently, transparent and semitransparent regions can be combined on a trimming mask, both of which are intended for a trimming of undesirable resist structures and not for the formation of "active" resist structures for the integrated circuit.

A corresponding method for producing the trimming mask can provide for first determining testwise the Bossung curve for the primary mask and establishing a semitransparent or a fully transparent region depending on the determined shape of the curve for a specific arrangement of structure elements in the structure pattern on the first mask at the same position on the trimming mask.

3.) A further configuration according to the invention can include reducing the transparency of the semitransparent regions by introducing a substructure into the latter. In this case, the substructure, can, for example, have openings separated by narrow opaque webs. The lateral dimension of the step size P (period) of mutually adjacent openings can lie below or at least near to the resolution limits, i.e., $$P \approx 0.50*(\lambda/NA).$$

Such structure elements, also called sub-resolution structures, depending on the wavelength $\lambda$, the resist properties, the numerical aperture NA, and the illumination setting of the projection system, are not printed, i.e., not formed as resist structures in the photosensitive layer. In this case, the densely packed openings, which are intrinsically light-transmissive, can have the effect that light of the zeroth order of diffraction passes to the photosensitive layer on the semiconductor substrate. A reduction of the intensity required for an exposure can be present, thereby reducing the incipient exposure of the active resist structures already transferred in the first exposure with the primary or phase mask.

By a targeted adaptation of the ratio of gap to web width, it is possible to adapt the transparency of the semitransparent trimming region to the lithographic requirements. For this solution approach, too, one embodiment provides for fully transparent regions to also be used in combination and/or in addition to the semitransparent regions intended for trimming. The embodiment described last may be realized both using a mask blank as described under 1.) or 2.) and by a conventional chrome mask blank or a blank used for the production of a tritone phase mask.

In a further embodiment of the mask according to the invention, semitransparent gaps in the variants described above can also be used for structure regions in which no disturbing resist structures are to be removed. For special line width/grid period ratios, a well-dosed incipient exposure of the active resist structure can enable the depth of focus to be increased. This technique is employed primarily when a minimum depth of focus required for circuit production cannot be obtained by the single exposure with only the primary mask.

The trimming mask according to the invention is not restricted to application in combination with alternating phase masks. The technique can be employed in the combination with all techniques for which a removal of undesirable resist structures in the photosensitive layer is necessary on account of the particular features of the mask technique, such as, e.g., in the case of chromeless masks.

Furthermore, according to the invention, the technique provided can also be applied to those mask types which do not require a removal of resist structures produced by the exposure of an individual mask. The technique according to the invention can also be applied to those structure geometries which have an excessively small process window in the single exposure.

The transmission-controlled trimming mask according to the invention, by control of the incipient exposure of the active resist structures, can permit an enlargement of the process window, in particular of the depth of focus, as a result of which the line width stability can be improved. As a result, relatively fewer geometries of the structure arrangements have to be prohibited for the design of circuits. The design can thereby be improved from the standpoint of an optimized integration density and consequently very high manufacturing productivity.

Furthermore, the mask according to the invention can reduce its average transmission and thus the relative proportion of the scattered light caused at the glass areas of the objective, which likewise has an improving effect on the line width stability of the imaging.

Moreover, an increase in the depth of focus can tend to lead to a reduced rework rate and, consequently, to an increase in the product yield.

The combination of an opaque structure element on a first mask and a semitransparent region positionally assigned to the structure element on a second mask can be supplemented by a further combination of a transparent structure element on the first mask with a further semitransparent region on the second mask. Consequently, it is possible to image both opaque and transparent structure elements on a mask equally with an improved process window with the aid of a second, assigned mask.

A method for producing the set of at least two masks can include:

a) prescribing an electronically stored first data representation of the first mask with an opaque structure element at a first position on the first mask, b) prescribing at least one set of exposure parameters of a projection system, for example, a wavelength λ of the light used for the projection of at least one second mask into a photosensitive layer on a semiconductor wafer in the projection system, a numerical aperture NA, and parameters of an illumination system, c) prescribing at second data representation of the second mask with a semitransparent region formed at a second position on the second mask, which second position corresponds to the first position on the first mask, the semitransparent region having a transparency, d) prescribing a first focus setting of the projection system, e) simulating the image of the opaque structure element and the semitransparent region in the photosensitive layer on the semiconductor wafer by the first and the second data representation on the basis of the prescribed exposure parameters and the focus setting, f) determining the lateral dimension of the simulated image from a superposition of the images of the first structure element and the semitransparent region in the photosensitive layer, g) repeating steps e) to g) for at least two further focus settings, which are different from one another, for determining the lateral dimension of the simulated image as a function of the focus settings, h) prescribing a limit value for a depth of field range of the imaging, i) determining the depth of field range of the imaging from the function, j) comparing the depth of field range determined with the limit value, k) depending on the comparison result, adapting the transparency of the semitransparent region in the second data representation of the second mask, and l) electronically storing the second data representation of the second mask.

The data representation may be a GDSII file, for example. However, any other data format which is familiar to the practiced person skilled in the art and in which the design or layout of the structures on a mask can be stored electronically is also conceivable.

One aspect of the method according to the invention can provide for a line width adaptation of the opaque structure element to be carried out in a manner dependent on the precise value of the adaptation of the transparency. Such a procedure may change the process window and react upon the imaging properties of the structure elements formed on the first mask.

Prescribing a further opaque structure element in the second data representation of the second mask, and for assigning to the structure element in the second data representation a further semitransparent region in the first data representation of the first mask can be provided. Method steps d) to l) may then be repeated in order to adapt the transparency of the further semitransparent region on the first mask. Consequently, semitransparent regions according to the invention can be patterned on both masks. The regions can improve the process window of the imaging of openings respectively formed on the other mask.

In this case, the first mask may be of an arbitrary mask type, in particular, a chromeless, an alternating, a half tone, a tri-tone phase mask, or a chrome mask.

BRIEF DESCRIPTION OF THE FIGURES

The invention will now be explained in more detail using an exemplary embodiment with the aid of a drawing, in which:

FIGS. 3A and 3B show a cross section through and a plan view of a trimming mask, respectively, assigned to the alternating phase mask from FIG. 2 with a semitransparent region in accordance with a second exemplary embodiment of the invention;

FIG. 4 shows exemplary configurations of auxiliary structures (sub-resolution features) for forming semitransparent regions;

FIGS. 6A and 6B show the process window which can be obtained with a set of masks in accordance with the prior art and in accordance with a fourth exemplary embodiment of the invention respectively.

DETAILED DESCRIPTION

Figure 1:
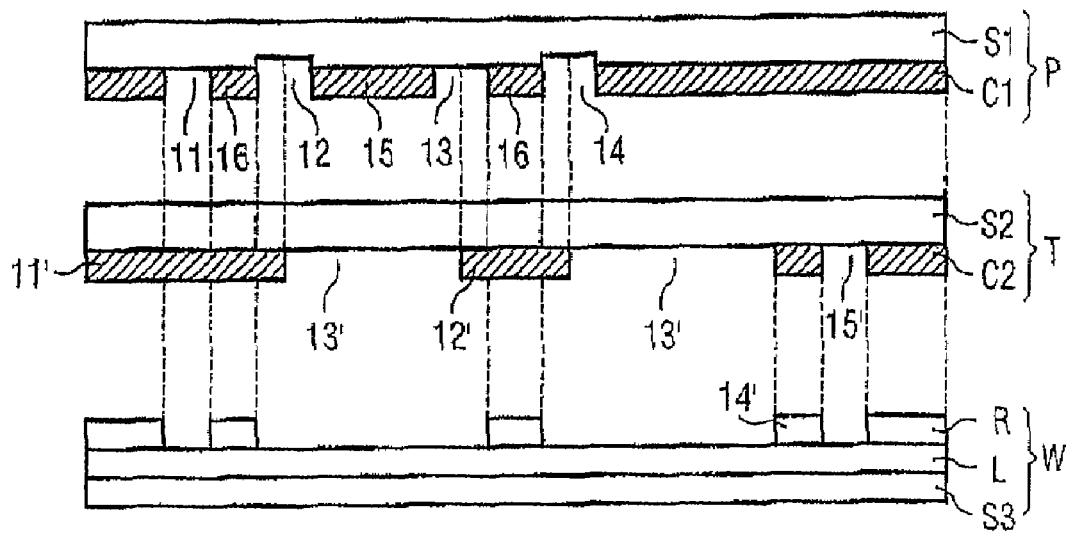
FIG. 1 shows a cross section through an alternating phase mask and a trimming mask assigned thereto in accordance with the prior art.

FIG. 1 shows an alternating phase mask P and a trimming mask T assigned to the mask P. the trimming mask can be a chrome mask in accordance with the prior art. Situated on the mask P are openings 11 to 14, which can be formed in an opaque chrome layer C1 on a transparent substrate S1. The respectively adjacent openings 11 and 12, and 13 and 14, can have a phase deviation which alternates between 0° and 180°. By the chrome web 16, the desired resist webs can be produced on the substrate S3 in positive resist.

A resist structure produced by shading by the chrome web 15 on the wafer W in a photosensitive layer R in the case of projection is undesirable (intermediate state not illustrated in FIG. 1). It can therefore be exposed away or post exposed by an opening 13' arranged on the trimming mask T in a chrome layer C2 on a transparent substrate S2 in a second exposure.

The chrome web 11' and 12' situated on the trimming mask can prevent a large-area irradiation of the resist webs produced with the primary mask P. At the same time, the gaps 13', 15' on the trimming mask T can produce openings in the photosensitive layer R and thus a resist web 14' on the wafer W. In this case, the position of the left-hand gap 13' in FIG. 1 on the trimming mask T can be adapted to the position of the chrome structure 15 situated on the phase mask P.

Figure 2:
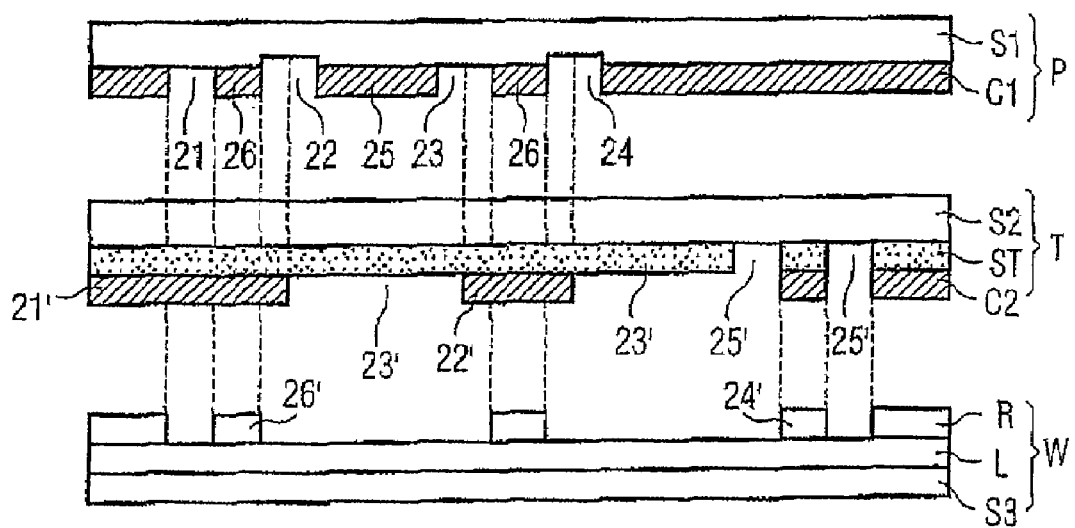
FIG. 2 shows a cross section through an alternating phase mask and a trimming mask assigned thereto with a semitransparent region in accordance with a first exemplary embodiment of the invention.

FIG. 2 shows a first exemplary embodiment of a trimming mask T according to the invention for the same layout of a primary mask P such as is illustrated in FIG. 1. The trimming gaps 23' used for exposing away the undesirable resist webs can be transmission-reduced due to a semitransparent layer ST arranged between the substrate S2 and an opaque layer C2. The layer C2 can be formed from chrome, for example. The layer ST can include, for example molybdenum silicide (MoSi) or materials which are comparable from optical standpoints and are sufficiently known to the competent person skilled in the art for reduction of the transmission. The layer ST can have a transparency of between 20% and 80%, for example, 50%.

Furthermore, the trimming mask T can have fully transparent gaps 25' for imaging "active" structures, which are not critical in respect of resolution. The gaps can produce a resist web 24' on the wafer W. According to the invention, the transparency of the layer ST can be chosen such that, taking account of the technological conditions, the removal of the undesirable resist web can be ensured, i.e., the exposure can be so intensive that a developer operation can remove this resist structure.

Within the openings 23', the semitransparent layer ST is not removed from the glass carrier. The position of the openings can correspond to he undesirable line. This ensures that significantly less light can radiate through the trimming gap 23'. Consequently, scattered light that is produced in this case can erode the quality of the webs 26' to be produced to a relatively lesser extent.

FIG. 3A illustrates a cross-sectional profile of an second exemplary embodiment of a trimming mask T according to the invention, which is assigned to the conventional phase mask P as illustrated in FIG. 1. In this case, the trimming gaps 33 have a substructure in the form of a grid. The grid has a grid period or a spatial frequency $F_g$ in the limiting range of the resolution. The limiting range of the resolution can be determined by a grid period equal to $0.5*(\lambda/NA)$. The substructure of the trimming gap can make it possible to reduce the transparency of the trimming gap without the occurrence of a direct imaging of the substructure in the photosensitive layer. Consequently, the region 33 of the relevant trimming gaps is transmission-reduced, i.e., semitransparent. By defining the structure density, i.e., the ratio of opaque mask area to transparent mask area relative to this semitransparent region 33, it is possible to control the degree of transmission on the mask and thus the intensity of the radiation occurring on the wafer.

FIG. 3B illustrates a plan view of the trimming mask of the arrangement of the semitransparent regions 33 formed by the substructures 38, of the chrome webs 32 and of the transparent lines 35. The cross section shown in FIG. 3A runs along a line AB in FIG. 3B. In the example, the grid lines of the auxiliary structures run parallel to the line represented by the semitransparent region in so far as it runs vertically in FIG. 3B.

A trimming gap 33 auxiliary structures which do not affect imaging on the wafer, i.e., grid lines 38, which run perpendicular to the longitudinal extent of the semitransparent trimming gap 33, can be introduced.

In the case of parallel orientation, by analogy with the known SRAF technique (SRAF: sub resolution assist feature) an increase in the depth of focus of the trimming gap 33 characterized by the substructures 38 can be furthermore obtained in addition to a reduction of the transparency of the gap.

In principle, lines having a very varied width of the respective bright regions (below the resolution limit), contact hole groups, chessboard pattern arrangements, chrome or phase gratings, etc. can be provided for the formation of the trimming gap substructures 38. FIG. 4 diagrammatically shows various forms of design of such structures which are arranged, e.g., along a line 33. The example of contact hole groups is used to demonstrate how it is possible to control the transmission through the density of the contact holes with a diameter in each case below the resolution limit of between 20% and 80%.

Figure 5A:
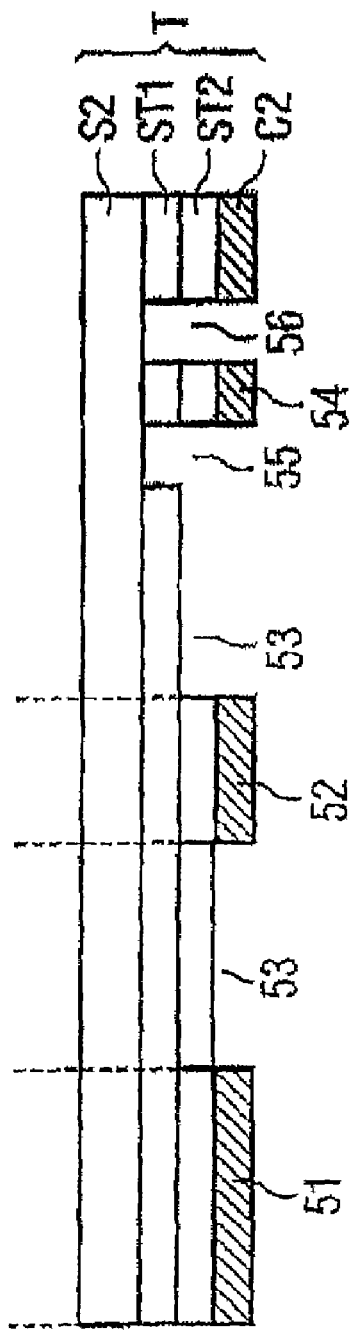
FIGS. 5A and 5B show a cross section through a trimming mask assigned to the alternating phase mask from FIG. 2 with a semitransparent region in accordance with a third exemplary embodiment of the invention, and a transmission profile which can be obtained in a single exposure with the mask, respectively.
Figure 5B:
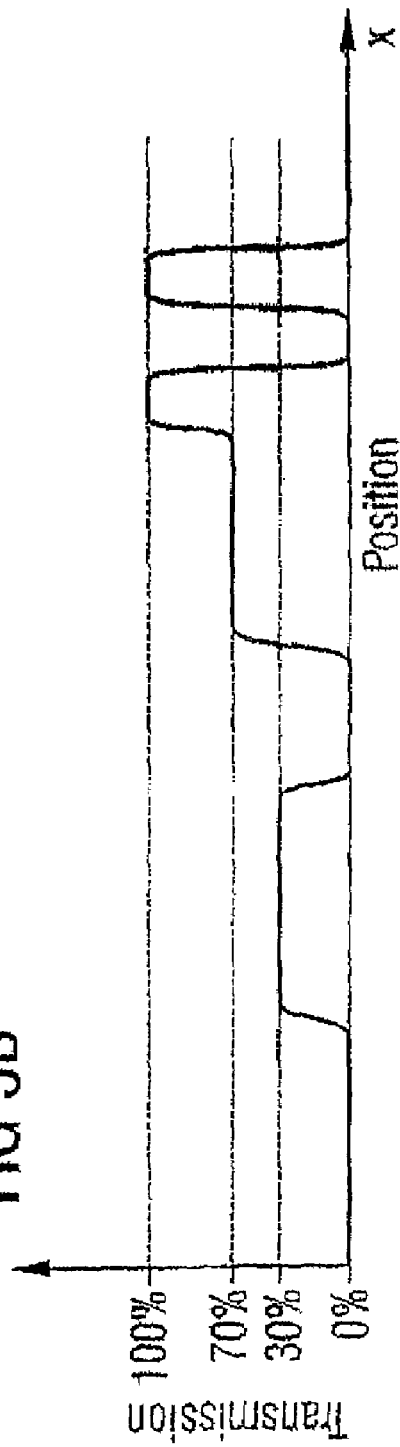

FIGS. 5A and 5B show a third exemplary embodiment of a trimming mask T according to the invention. As a modification from the example according to FIG. 2, two semitransparent layers ST1 and ST2 are provided here. Light can radiate through a first trimming gap 53 (on the left in the figure) for exposing away an undesirable resist structure in the photosensitive layer, which is arranged in the opaque layer C2, said light passing through both the first and the second semitransparent layer. The light can be attenuated to a relatively greater extent here, for example, by 70%, as can be seen in the intensity profile of FIG. 5B (degree of transmission 30%). A second trimming gap 53 (on the right in FIG. 5A) can have the first semitransparent layer ST1. The second semitransparent layer ST2 can be removed within the gap. The light radiated through can be attenuated here, for example, by 30% (degree of transmission 70%). In this case, the thickness and/or the refractive index of the semitransparent layer ST2 can be such that the phase deviation is an integer multiple of 360 degrees so that the transition between the region 53 and the region 55 does not exhibit a relatively sudden phase change which acts in a structure-forming manner in the resist.

The gaps 55 and 56 serving to form an active structure 24' on the wafer can be formed with an opened first and second semitransparent layer ST1, ST2. Consequently, different degrees of transmission, which enable a lithographic process window which is adapted to the respective structure element arrangement and is therefore larger, can be possible.

FIGS. 6A and 6B show results for process windows that can be obtained in a comparison between a trimming mask in accordance with the prior art (FIG. 6A) and a trimming mask in accordance with the second exemplary embodiment of the present invention (FIG. 6B). The trimming gaps 13' (prior art) and 33 (invention) are diagrammatically illustrated on the left beside the diagram for the process window. In the diagram, the radiation dose is plotted against the focused setting (defocus). The curves in the diagram designate the dose leeway (process window) of a 130 nm wide resist web for a permissible line width variation of +/−15 nm. A width of 185 nm was taken as a basis for the width of the phase-shifting region 11, 12, 13, 14. With the use of the transmission-reduced trimming gaps 33 according to the invention, it is possible to obtain a relatively significant improvement in the process window in comparison to the prior art.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

C1 opaque layer of the first mask
C2 opaque layer of the second mask
L layer
P first mask, primary mask
R photosensitive layer
S1 substrate of the first mask
S2 substrate of the second mask
S3 substrate of the semiconductor wafer
T second mask, secondary mask, trimming mask
W semiconductor wafer
13' transparent region
15, 25 opaque structure element
21-24 transparent structure elements on first mask
21', 22',31,32,51,52 opaque structures on second mask
23', 53 semitransparent region
24', 26' unexposed resist structures
25', 35, 55, 56 transparent region on second mask
33 semitransparent region with nonprinting substructures
38 nonprinting substructures (dummy structures)

We claim:

1. A set of masks for the projection of structure patterns in a photosensitive layer on a semiconductor wafer in a projection system in each case, the structure patterns being arranged on the masks of the set and coordinated with one another, into the same comprising:
   a first mask having at least one essentially opaque structure element, the structure element being arranged at a first position on the first mask so that by projection of its image in the photosensitive layer on the semiconductor wafer, a still unexposed resist region is formed in the photosensitive layer; and
   at least one second mask assigned to the first mask, the second mask having at least one semitransparent region, the semitransparent region being arranged at a second position on the second mask, the second position corresponding to the first position on the first mask such that by projection of its image in the photosensitive layer on the semiconductor wafer at least part of the resist region is exposed in the photosensitive layer,
   wherein the semitransparent region has a radiated light transparency of more than 20 percent and less than 80 percent and wherein the transparency is selected so as to control diffraction effects at trimming mask gaps to obtain a maximum depth of focus.

2. The set of masks as claimed in claim 1, wherein the second mask has a transparent substrate, a semitransparent layer arranged on the transparent substrate, and an opaque layer arranged on the semitransparent layer, and the semitransparent region is formed as an opening in the opaque layer.

3. The set of masks as claimed in claim 2, wherein the semitransparent layer is configured based on a layer thickness or a material-dependent refractive index to apply a phase deviation of an integer multiple of 360 degrees to a light radiated onto the semitransparent layer.

4. The set of masks as claimed in claim 1, wherein the second mask has an opaque layer arranged on a transparent substrate, the semitransparent region is formed as a plurality of openings in the opaque layer, the openings being arranged in each case in a pitch P with respect to one another, and
   the pitch P of a first of the openings with respect to a second of the openings directly adjacent to it in a direction on the second mask is not more than half the wavelength of the radiated light divided by the numerical aperture of the projection system so that, in the case of the projection of the second mask, each of the plurality of openings cannot be resolved on the semiconductor wafer.

5. The set of masks as claimed in claim 4, wherein the pitch P of mutually adjacent sub-resolution openings in the opaque layer is the same for each of the plurality of openings so that the openings in the opaque layer form a periodic grid and the pitch P represents a grid period.

6. The set of masks as claimed in claim 5, wherein the sub-resolution openings are formed as long narrow lines in the grid, the semitransparent region including the sub-resolution openings is formed as a line, and the long narrow lines are arranged parallel to the line of the semitransparent region.

7. The set of masks as claimed in claim 5, wherein the sub-resolution openings are formed as long narrow lines in the grid, the semitransparent region including the sub-resolution openings is formed as a line, and the long narrow lines are arranged perpendicular to the line of the semitransparent region.

8. The set of masks as claimed in claim 1, wherein the first mask is an alternating phase mask.

9. The set of masks as claimed in claim 1, wherein at least one transparent opening is formed at a further first position on the first mask, at least one further semitransparent region assigned to the transparent opening is formed at a further second position on the second mask, and the first further position on the first mask is relatively similar to the second further position on the second mask.

* * * * *

UNITED STATES PATENT AND TRADEMARK OFFICE
CERTIFICATE OF CORRECTION

PATENT NO.       : 7,393,614 B2
APPLICATION NO.  : 10/792693
DATED            : July 1, 2008
INVENTOR(S)      : Roderick Kohle et al.

It is certified that error appears in the above-identified patent and that said Letters Patent is hereby corrected as shown below:

Column 3, line 11: replace "as well" with -- as well) --;

Column 6, line 26: replace "to 1)" with -- to l) --.

Signed and Sealed this

Twenty-third Day of December, 2008

JON W. DUDAS
*Director of the United States Patent and Trademark Office*

UNITED STATES PATENT AND TRADEMARK OFFICE
CERTIFICATE OF CORRECTION

PATENT NO.         : 7,393,614 B2                                            Page 1 of 1
APPLICATION NO. : 10/792693
DATED              : July 1, 2008
INVENTOR(S)        : Roderick Kohle et al.

It is certified that error appears in the above-identified patent and that said Letters Patent is hereby corrected as shown below:

Column 3, line 11: replace "as well" with -- as well) --;

Column 6, line 26: replace "to 1)" with -- to l) --.

This certificate supersedes the Certificate of Correction issued December 23, 2008.

Signed and Sealed this

Twenty-fourth Day of February, 2009

JOHN DOLL
*Acting Director of the United States Patent and Trademark Office*